United States Patent
Chang et al.

(10) Patent No.: US 10,250,228 B2
(45) Date of Patent: Apr. 2, 2019

(54) BULK ACOUSTIC WAVE RESONATOR WITH A MASS ADJUSTMENT STRUCTURE AND ITS APPLICATION TO BULK ACOUSTIC WAVE FILTER

(71) Applicant: WIN Semiconductors Corp., Kuei Shan Hsiang, Tao Yuan Shien (TW)

(72) Inventors: Chia-Ta Chang, Tao Yuan Shien (TW); Chih-Feng Chiang, Tao Yuan Shien (TW); Tzu-Sheng Hsieh, Tao Yuan Shien (TW)

(73) Assignee: WIN SEMICONDUCTORS CORP., Tao Yuan Shien (TW)

(*) Notice: Subject to any disclaimer, the term of this patent is extended or adjusted under 35 U.S.C. 154(b) by 56 days.

(21) Appl. No.: 15/430,315

(22) Filed: Feb. 10, 2017

(65) Prior Publication Data
US 2018/0109240 A1 Apr. 19, 2018

(30) Foreign Application Priority Data
Oct. 17, 2016 (TW) .............................. 105133460 A (51) Int. Cl.
*H03H 9/58* (2006.01)
*H03H 9/17* (2006.01)
*H03H 9/54* (2006.01)

(52) U.S. Cl.
CPC .............. *H03H 9/583* (2013.01); *H03H 9/17* (2013.01); *H03H 9/54* (2013.01)

(58) Field of Classification Search
CPC ............. H03H 9/17; H03H 9/54; H03H 9/583

USPC .......................................................... 333/188
See application file for complete search history.

(56) References Cited

U.S. PATENT DOCUMENTS

2008/0051039 A1* 2/2008 Iwasaki .................. H03H 9/173
455/73
2010/0013573 A1* 1/2010 Umeda ................ H03H 9/0095
333/186

OTHER PUBLICATIONS

NDT Resource center Applet for calculating Acoustic impedance of materials, the website last updated on Sep. 2014.*

* cited by examiner

*Primary Examiner* — Benny T Lee
*Assistant Examiner* — Hafizur Rahman
(74) *Attorney, Agent, or Firm* — Muncy, Geissler, Olds & Lowe, P.C.

(57) ABSTRACT

A bulk acoustic wave resonator with a mass adjustment structure comprises a supporting layer, a lower metal layer, a piezoelectric layer, an upper metal layer and a mass adjustment structure. The supporting layer is formed on a substrate. The supporting layer has a cavity, and the cavity has a top-inner surface. The lower metal layer is formed on the supporting layer. The piezoelectric layer is formed on the lower metal layer. The upper metal layer is formed on the piezoelectric layer. An acoustic wave resonance region is defined by an overlapping region of projections of the upper metal layer, the piezoelectric layer, the lower metal layer, the supporting layer and the cavity. The acoustic wave resonance region is divided into a peripheral region and a central region. The mass adjustment structure comprises a peripheral mass adjustment structure formed on the top-inner surface within the peripheral region.

14 Claims, 7 Drawing Sheets

BULK ACOUSTIC WAVE RESONATOR WITH A MASS ADJUSTMENT STRUCTURE AND ITS APPLICATION TO BULK ACOUSTIC WAVE FILTER

FIELD OF THE INVENTION

The present invention relates to a bulk acoustic wave resonator with a mass adjustment structure, which have the advantages of increasing the mechanical strength of the resonance film of the bulk acoustic wave resonator, enhancing the Q factor of the bulk acoustic wave resonator, and suppressing the spurious mode.

BACKGROUND OF THE INVENTION

Figure 10:
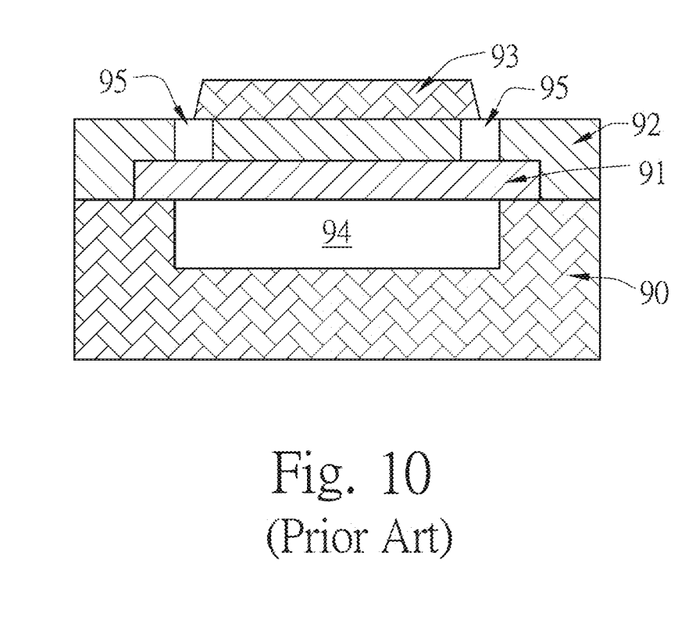
FIG. 10 is a schematic view of an embodiment of a bulk acoustic wave resonator of the conventional technology.

Please refer to FIG. 10, which is a schematic view of an embodiment of a bulk acoustic wave resonator of the conventional technology. The resonator comprises a substrate 90, a bottom electrode 91, a piezoelectric layer 92, a top electrode 93, a cavity 94 and an annular piezoelectric layer recess 95. The bottom electrode 91 is formed on the substrate 90. The piezoelectric layer 92 is formed on the bottom electrode 91. The top electrode 93 is formed on the piezoelectric layer 92. The cavity 94 is formed under the bottom electrode 91 on the substrate 90. The overlapping of the top electrode 93, the piezoelectric layer 92 and the bottom electrode 91 form a resonance film of the bulk acoustic wave resonator. The annular piezoelectric layer recess 95 is formed by removing the material of the piezoelectric layer 92 around the periphery of the resonance film of the bulk acoustic wave resonator. By forming the annular piezoelectric layer recess 95, the boundary condition of the periphery of the resonance film of the bulk acoustic wave resonator is changed. Since the boundary condition of the periphery of the resonance film of the bulk acoustic wave resonator is changed, the ratio of the reflection acoustic wave and the incident acoustic wave is also changed when then incident acoustic wave reflects at the periphery of the resonance film of the bulk acoustic wave resonator. By designing and adjusting a proper width and a proper depth of the annular piezoelectric layer recess 95, the ratio of the reflection acoustic wave and the incident acoustic wave may be adjusted such that the Q factor of the bulk acoustic wave resonator is enhanced.

Since a width of the resonance film of the bulk acoustic wave resonator is usually much greater than a depth of the cavity 94, and furthermore the resonance film of the bulk acoustic wave resonator is formed by the top electrode 93, the piezoelectric layer 92 and the bottom electrode 91, especially the top electrode 93 and the bottom electrode 91 are formed by metal, therefore, the resonance film of the bulk acoustic wave resonator may be bended downwardly when affected by stress. Hence, a bottom of the bottom electrode 91 is possibly touched with the substrate 90 (a bottom of the cavity 94) such that the characteristics of the bulk acoustic wave resonator may be affected. Removing the material of the piezoelectric layer 92 around the periphery of the resonance film of the bulk acoustic wave resonator to form the annular piezoelectric layer recess 95 may affect the mechanical structure strength of the resonance film of the bulk acoustic wave resonator such that the resonance film of the bulk acoustic wave resonator become more easily bended downwardly when affected by stress. Moreover, the insufficient mechanical strength of the resonance film of the bulk acoustic wave resonator may even result in collapse of the resonance film of the bulk acoustic wave resonator.

Since the acoustic wave is propagating and resonating in the resonance film of the bulk acoustic wave resonator, therefore whether the entire flatness of the top electrode 93, the piezoelectric layer 92 and the bottom electrode 91 of the resonance film of the bulk acoustic wave resonator may directly affect the characteristics of the bulk acoustic wave resonator. In another embodiment of a bulk acoustic wave resonator of the conventional technology, a protruding structure is formed along an edge of a top surface of the bottom electrode 91. By forming the protruding structure, the boundary condition of the periphery of the resonance film of the bulk acoustic wave resonator is changed such that the ratio of the reflection acoustic wave and the incident acoustic wave is also changed. By designing and adjusting a proper dimension of the protruding structure, the ratio of the reflection acoustic wave and the incident acoustic wave may be adjusted such that the Q factor of the bulk acoustic wave resonator is enhanced. However forming the protruding structure along the edge of the top surface of the bottom electrode 91, the flatness of the piezoelectric layer 92 may be poor such that the entire flatness of the resonance film of the bulk acoustic wave resonator is affected. Hence, the characteristics of the acoustic wave propagating in the resonance film of the bulk acoustic wave resonator may be affected so that the characteristics of the bulk acoustic wave resonator are adversely affected.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problems that the present invention is seeking to solve are to increase the mechanical strength of the resonance film of the bulk acoustic wave resonator, to avoid affecting the entire flatness of the resonance film of the bulk acoustic wave resonator, and, in the mean while, suppress the spurious mode of the bulk acoustic wave resonator.

In order to solve the problems mentioned the above and to achieve the expected effect, the present invention provides a bulk acoustic wave resonator with a mass adjustment structure comprising a supporting layer, a lower metal layer, a piezoelectric layer, an upper metal layer and a mass adjustment structure. The supporting layer is formed on a substrate, wherein the supporting layer has a cavity; the cavity has a top-inner surface. The lower metal layer is formed on the supporting layer. The piezoelectric layer is formed on the lower metal layer. The upper metal layer is formed on the piezoelectric layer. An acoustic wave resonance region is defined by an overlapping region of projections of the upper metal layer, the piezoelectric layer, the lower metal layer, the supporting layer and the cavity, wherein the acoustic wave resonance region is divided into a peripheral region and a central region. The mass adjustment structure comprises a peripheral mass adjustment structure, wherein the peripheral mass adjustment structure is formed on the top-inner surface within the peripheral region. The peripheral mass adjustment structure has a dimension, such as a thickness and a width. By forming the mass adjustment structure (including the peripheral mass adjustment structure), the boundary condition of the periphery of an acoustic resonance film which is formed by the upper metal layer, the piezoelectric layer and the lower metal layer of the bulk acoustic wave resonator within the acoustic wave resonance region may be changed. Since the boundary condition of the periphery of the acoustic resonance film of the bulk acoustic wave resonator is changed, the ratio of the reflection acoustic wave and the incident acoustic wave is also changed when then incident acoustic wave reflects at the periphery of the acoustic resonance film of the bulk acoustic wave resonator. By designing and adjusting a proper dimension of the mass adjustment structure (such as designing and adjusting a proper thickness or a proper width of the mass adjustment structure), the ratio of the reflection acoustic wave and the incident acoustic wave may be adjusted such that the Q factor of the bulk acoustic wave resonator is enhanced and, in the mean while, the spurious mode of the bulk acoustic wave resonator is suppressed. Furthermore, the supporting layer may effectively enhance the mechanical structure strength of the bulk acoustic wave resonator. Therefore, it may avoid the bulk acoustic wave resonator bending downwardly to touch the substrate when affected by stress such that the characteristics of the bulk acoustic wave resonator are affected. Moreover, enhancing the mechanical strength of the acoustic resonance film of the bulk acoustic wave resonator may avoid the collapse of the acoustic resonance film of the bulk acoustic wave resonator.

In an embodiment, wherein the mass adjustment structure further comprises a central mass adjustment structure, wherein the central mass adjustment structure is formed on the top-inner surface within the central region; and wherein a thickness of the peripheral mass adjustment structure is unequal to a thickness of the central mass adjustment structure.

In an embodiment, wherein the mass adjustment structure further comprises a central mass adjustment structure, wherein the central mass adjustment structure is formed on the top-inner surface within the central region; wherein the peripheral region is divided into a first peripheral sub-region and a second peripheral sub-region; wherein the second peripheral sub-region is between the central region and the first peripheral sub-region; and wherein the peripheral mass adjustment structure includes a first peripheral mass adjustment sub-structure, the first peripheral mass adjustment sub-structure is formed within the first peripheral sub-region.

In an embodiment, wherein the peripheral mass adjustment structure further includes a second peripheral mass adjustment sub-structure, wherein the second peripheral mass adjustment sub-structure is formed within the second peripheral sub-region; wherein a thickness of the second peripheral mass adjustment sub-structure is unequal to a thickness of the first peripheral mass adjustment sub-structure; and wherein the thickness of the second peripheral mass adjustment sub-structure is unequal to a thickness of the central mass adjustment structure.

In an embodiment, wherein the peripheral mass adjustment structure includes a second peripheral mass adjustment sub-structure; wherein the peripheral region is divided into a first peripheral sub-region and a second peripheral sub-region; wherein the second peripheral sub-region is between the central region and the first peripheral sub-region; and wherein the second peripheral mass adjustment sub-structure is formed within the second peripheral sub-region.

In an embodiment, wherein the mass adjustment structure further comprises a central mass adjustment structure, wherein the central mass adjustment structure is formed on the top-inner surface within the central region; and wherein a thickness of the second peripheral mass adjustment sub-structure is unequal to a thickness of the central mass adjustment structure.

In an embodiment, wherein the peripheral mass adjustment structure further includes a first peripheral mass adjustment sub-structure, wherein the first peripheral mass adjustment sub-structure is formed within the first peripheral sub-region; and wherein a thickness of the second peripheral mass adjustment sub-structure is unequal to a thickness of the first peripheral mass adjustment sub-structure.

In an embodiment, wherein the mass adjustment structure is made of a metal material, an insulator material, or a semiconductor material.

In an embodiment, wherein the metal material is at least one material selected from the group consisting of: Ti, Mo, Pt, Al, Au, W and Ru; the insulator material is at least one material selected from the group consisting of: silicon oxide, silicon nitride, aluminum nitride and polymer; the semiconductor material is at least one material selected from the group consisting of: GaAs, InGaP, InGaAs and InP.

In an embodiment, wherein the material of the supporting layer is at least one material selected from the group consisting of: silicon oxide, silicon nitride, aluminum nitride and polymer.

In addition, the present invention further provides a bulk acoustic wave filter comprising a plural of bulk acoustic wave resonators. The plural of bulk acoustic wave resonators are formed on a substrate. Each of the plural of bulk acoustic wave resonators comprises a supporting layer, a lower metal layer, a piezoelectric layer and an upper metal layer. The supporting layer is formed on the substrate, wherein the supporting layer has a cavity; the cavity has a top-inner surface. The lower metal layer is formed on the supporting layer. The piezoelectric layer is formed on the lower metal layer. The upper metal layer is formed on the piezoelectric layer. An acoustic wave resonance region is defined by an overlapping region of projections of the upper metal layer, the piezoelectric layer, the lower metal layer, the supporting layer and the cavity, wherein the acoustic wave resonance region is divided into a peripheral region and a central region. Among the plural of bulk acoustic wave resonators, at least two of them have a mass adjustment structure respectively. The mass adjustment structure has any one of following Geometrical Configurations: Geometrical Configuration I: the mass adjustment structure comprises a peripheral mass adjustment structure, wherein the peripheral mass adjustment structure is formed on the top-inner surface within the peripheral region; wherein the peripheral mass adjustment structure has a thickness and a width; Geometrical Configuration II: the mass adjustment structure comprises a central mass adjustment structure and a peripheral mass adjustment structure; wherein the central mass adjustment structure is formed on the top-inner surface within the central region; wherein the peripheral mass adjustment structure is formed on the top-inner surface within the peripheral region; wherein the central mass adjustment structure has a thickness; wherein the peripheral mass adjustment structure has a thickness and a width; wherein the thickness of the peripheral mass adjustment structure is unequal to the thickness of the central mass adjustment structure; Geometrical Configuration III: the mass adjustment structure comprises a central mass adjustment structure and a first peripheral mass adjustment sub-structure; wherein the central mass adjustment structure is formed on the top-inner surface within the central region; wherein the peripheral region is divided into a first peripheral sub-region and a second peripheral sub-region; wherein the second peripheral sub-region is between the central region and the first peripheral sub-region; wherein the first peripheral mass adjustment sub-structure is formed on the top-inner surface within the first peripheral sub-region; wherein the first peripheral mass adjustment sub-structure has a thickness and a width; wherein the central mass adjustment structure has a thickness; Geometrical Configuration IV: the mass adjustment structure comprises a central mass adjustment structure, a first peripheral mass adjustment sub-structure and a second peripheral mass adjustment sub-structure; wherein the central mass adjustment structure is formed on the top-inner surface within the central region; wherein the peripheral region is divided into a first peripheral sub-region and a second peripheral sub-region; wherein the second peripheral sub-region is between the central region and the first peripheral sub-region; wherein the first peripheral mass adjustment sub-structure is formed on the top-inner surface within the first peripheral sub-region; wherein the second peripheral mass adjustment sub-structure is formed on the top-inner surface within the second peripheral sub-region; wherein the first peripheral mass adjustment sub-structure has a thickness and a width; wherein the second peripheral mass adjustment sub-structure has a thickness and a width; wherein the central mass adjustment structure has a thickness; wherein the thickness of the second peripheral mass adjustment sub-structure is unequal to the thickness of the first peripheral mass adjustment sub-structure; wherein the thickness of the second peripheral mass adjustment sub-structure is unequal to the thickness of the central mass adjustment structure; Geometrical Configuration V: the mass adjustment structure comprises a second peripheral mass adjustment sub-structure; wherein the peripheral region is divided into a first peripheral sub-region and a second peripheral sub-region; wherein the second peripheral sub-region is between the central region and the first peripheral sub-region; wherein the second peripheral mass adjustment sub-structure is formed on the top-inner surface within the second peripheral sub-region; and wherein the second peripheral mass adjustment sub-structure has a thickness and a width; Geometrical Configuration VI: the mass adjustment structure comprises a central mass adjustment structure and a second peripheral mass adjustment sub-structure; wherein the central mass adjustment structure is formed on the top-inner surface within the central region; wherein the peripheral region is divided into a first peripheral sub-region and a second peripheral sub-region; wherein the second peripheral sub-region is between the central region and the first peripheral sub-region; wherein the second peripheral mass adjustment sub-structure is formed on the top-inner surface within the second peripheral sub-region; wherein the second peripheral mass adjustment sub-structure has a thickness and a width; wherein the central mass adjustment structure has a thickness; wherein the thickness of the second peripheral mass adjustment sub-structure is unequal to the thickness of the central mass adjustment structure; and Geometrical Configuration VII: the mass adjustment structure comprises a first peripheral mass adjustment sub-structure and a second peripheral mass adjustment sub-structure; wherein the peripheral region is divided into a first peripheral sub-region and a second peripheral sub-region; wherein the second peripheral sub-region is between the central region and the first peripheral sub-region; wherein the first peripheral mass adjustment sub-structure is formed on the top-inner surface within the first peripheral sub-region; wherein the second peripheral mass adjustment sub-structure is formed on the top-inner surface within the second peripheral sub-region; wherein the first peripheral mass adjustment sub-structure has a thickness and a width; wherein the second peripheral mass adjustment sub-structure has a thickness and a width; wherein the thickness of the second peripheral mass adjustment sub-structure is unequal to the thickness of the first peripheral mass adjustment sub-structure. Among these bulk acoustic wave resonators (each of which has a mass adjustment structure), at least two of them have the mass adjustment structures with non-identical Geometrical Configurations. In generally, a bulk acoustic wave filter comprises two kinds of bulk acoustic wave resonators. The first kind of bulk acoustic wave resonators is a series bulk acoustic wave resonator which has a higher resonance frequency. The second kind of bulk acoustic wave resonators is a shunt bulk acoustic wave resonator which has a lower resonance frequency. Since the boundary condition of the periphery of the acoustic resonance film of the bulk acoustic wave resonator may be changed by forming the mass adjustment structure, the ratio of the reflection acoustic wave and the incident acoustic wave may also be changed. Different shape designs of the mass adjustment structure or the same shape design of the mass adjustment structure but with different dimensions may cause the change of the boundary condition of the periphery of the acoustic resonance film such that the ratio of the reflection acoustic wave and the incident acoustic wave is changed. Therefore, by respectively designing and adjusting the mass adjustment structures (having non-identical Geometrical Configurations) of the at least two bulk acoustic wave resonators of the bulk acoustic wave filter, the bulk acoustic wave resonators of the bulk acoustic wave filter may be adjusted respectively as two kinds of bulk acoustic wave resonators (including the series bulk acoustic wave resonator with higher resonance frequency and the shunt bulk acoustic wave resonator with lower resonance frequency), so as to respectively enhance the Q factor of both the series bulk acoustic wave resonator with higher resonance frequency and the shunt bulk acoustic wave resonator with lower resonance frequency of the bulk acoustic wave resonator and, in the mean while, suppress the spurious mode.

In an embodiment, wherein each of the mass adjustment structures is made of a metal material, an insulator material or a semiconductor material.

In an embodiment, wherein the metal material is at least one material selected from the group consisting of: Ti, Mo, Pt, Al, Au, W and Ru; the insulator material is at least one material selected from the group consisting of: silicon oxide, silicon nitride, aluminum nitride and polymer; the semiconductor material is at least one material selected from the group consisting of: GaAs, InGaP, InGaAs and InP.

In an embodiment, wherein the material of the supporting layer is at least one material selected from the group consisting of: silicon oxide, silicon nitride, aluminum nitride and polymer.

For further understanding the characteristics and effects of the present invention, some preferred embodiments referred to drawings are in detail described as follows.

DETAILED DESCRIPTIONS OF PREFERRED EMBODIMENTS

The present invention provides a bulk acoustic wave resonator with a mass adjustment structure, which comprises a supporting layer, a lower metal layer, a piezoelectric layer, an upper metal layer and a mass adjustment structure, wherein the supporting layer is formed on a substrate, wherein the supporting layer has a cavity; the cavity has a top-inner surface. The lower metal layer is formed on the supporting layer. The piezoelectric layer is formed on the lower metal layer. The upper metal layer is formed on the piezoelectric layer. An acoustic wave resonance region is defined by an overlapping region of projections of the upper metal layer, the piezoelectric layer, the lower metal layer, the supporting layer and the cavity, wherein the acoustic wave resonance region is divided into a peripheral region and a central region, wherein the peripheral region is divided into a first peripheral sub-region and a second peripheral sub-region, the second peripheral sub-region is between the central region and the first peripheral sub-region. The mass adjustment structure is formed on the top-inner surface within (1) the peripheral region, (2) the peripheral region and the central region, (3) the first peripheral sub-region and the central region, (4) the first peripheral sub-region, the second peripheral sub-region and the central region, (5) the second peripheral sub-region, (6) the second peripheral sub-region and the central region, or (7) the first peripheral sub-region and the second peripheral sub-region. In the present invention, since the mass adjustment structure is formed on the top-inner surface of the cavity (that is that the mass adjustment structure is connected with the supporting layer), the entire flatness of the upper metal layer, the piezoelectric layer and the lower metal layer of the bulk acoustic wave resonator will not be affected by the mass adjustment structure. Furthermore, according to the design of the present invention, before the lower metal layer is formed on the supporting layer, the supporting layer may be polished by a chemical mechanical polishing process so as to improve the flatness of a top surface of the supporting layer and, in the mean while, improve the entire flatness of the upper metal layer, the piezoelectric layer and the lower metal layer of the bulk acoustic wave resonator, thereby enhance the resonance characteristics of the bulk acoustic wave resonator.

Figure 1:
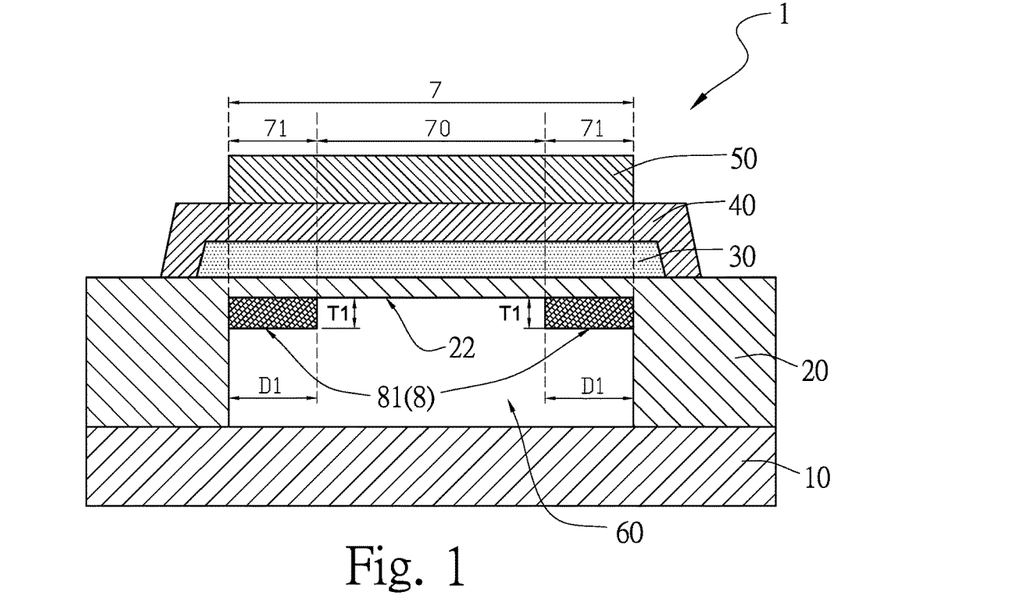
FIG. 1 is a schematic view of an embodiment of a bulk acoustic wave resonator with a mass adjustment structure (Geometrical Configuration I) of the present invention.

Please refer to FIG. 1, which is a schematic view of an embodiment of a bulk acoustic wave resonator with a mass adjustment structure (Geometrical Configuration I) of the present invention. A bulk acoustic wave resonator 1 is formed on a substrate 10. The bulk acoustic wave resonator 1 comprises a supporting layer 20, a lower metal layer 30, a piezoelectric layer 40, an upper metal layer 50 and a mass adjustment structure 8. The supporting layer 20 is formed on the substrate 10, wherein the supporting layer 20 has a cavity 60; the cavity 60 has a top-inner surface 22. The lower metal layer 30 is formed on the supporting layer 20. The piezoelectric layer 40 is formed on the lower metal layer 30. The upper metal layer 50 is formed on the piezoelectric layer 40. An acoustic wave resonance region 7 is defined by an overlapping region of projections of the upper metal layer 50, the piezoelectric layer 40, the lower metal layer 30, the supporting layer 20 and the cavity 60, wherein the acoustic wave resonance region 7 is divided into a peripheral region 71 and a central region 70. In current embodiment, the mass adjustment structure 8 has a Geometrical Configuration I. The Geometrical Configuration I: the mass adjustment structure 8 comprises a peripheral mass adjustment structure 81, wherein the peripheral mass adjustment structure 81 is formed on the top-inner surface 22 within the peripheral region 71; wherein the peripheral mass adjustment structure 81 has a thickness T1 and a width D1. By forming the mass adjustment structure 8, the boundary condition of the periphery of an acoustic resonance film which is formed by the upper metal layer 50, the piezoelectric layer 40 and the lower metal layer 30 of the bulk acoustic wave resonator 1 within the acoustic wave resonance region 7 is changed. Since the boundary condition of the periphery of the acoustic resonance film is changed, the ratio of the reflection acoustic wave and the incident acoustic wave is also changed when then incident acoustic wave reflects at the periphery of the acoustic resonance film. By designing and adjusting the dimension of the mass adjustment structure 8 (in current embodiment, such as designing and adjusting the thickness T1 or the width D1 of the peripheral mass adjustment structure 81), the ratio of the reflection acoustic wave and the incident acoustic wave may be adjusted such that the Q factor of the bulk acoustic wave resonator 1 is effectively enhanced and, in the mean while, the spurious mode is suppressed. Furthermore, the supporting layer 20 may effectively enhance the mechanical structure strength of the bulk acoustic wave resonator 1. Therefore, it may avoid the bulk acoustic wave resonator 1 bending downwardly to touch the substrate 10 when affected by stress such that the characteristics of the bulk acoustic wave resonator 1 are affected. Moreover, enhancing the mechanical strength of the acoustic resonance film of the bulk acoustic wave resonator 1 may avoid the collapse of the acoustic resonance film of the bulk acoustic wave resonator 1.

In some embodiments, the mass adjustment structure 8 may be made of metal material, insulator material or semiconductor material. The metal material may be at least one material selected from the group consisting of: Ti, Mo, Pt, Al, Au, W and Ru. The insulator material may be at least one material selected from the group consisting of: silicon oxide, silicon nitride, aluminum nitride and polymer. The polymer may include Benzo Cyclobutane (BCB). The semiconductor material may be at least one material selected from the group consisting of: GaAs, InGaP, InGaAs and InP.

In some embodiments, the mass adjustment structure 8 may include the combination of the materials mentioned above. For example, the mass adjustment structure 8 may include the combination of the metal materials mentioned above and the insulator materials mentioned above. For example, in an embodiment (please refer to FIG. 3), a first peripheral mass adjustment sub-structure 811 is made of the metal materials mentioned above, while the central mass adjustment structure 80 is made of the insulator materials mentioned above. For example, in another embodiment (please refer to FIG. 3), the peripheral mass adjustment structure 81 is formed by the stack of the metal materials mentioned above and the insulator materials mentioned above.

In the embodiments of the present invention, the material of the lower metal layer 30 may be at least one material selected from the group consisting of: Ti, Mo, Pt, Al, Au, W and Ru. The material of the upper metal layer 50 may be at least one material selected from the group consisting of: Ti, Mo, Pt, Al, Au, W and Ru. The material of the piezoelectric layer 40 may be at least one material selected from the group consisting of: aluminum nitride and Zinc Oxide. In the embodiments of the present invention, the material of the supporting layer 20 may be at least one material selected from the group consisting of: silicon oxide, silicon nitride, aluminum nitride and polymer. The polymer may include Benzo Cyclobutane (BCB).

Figure 2:
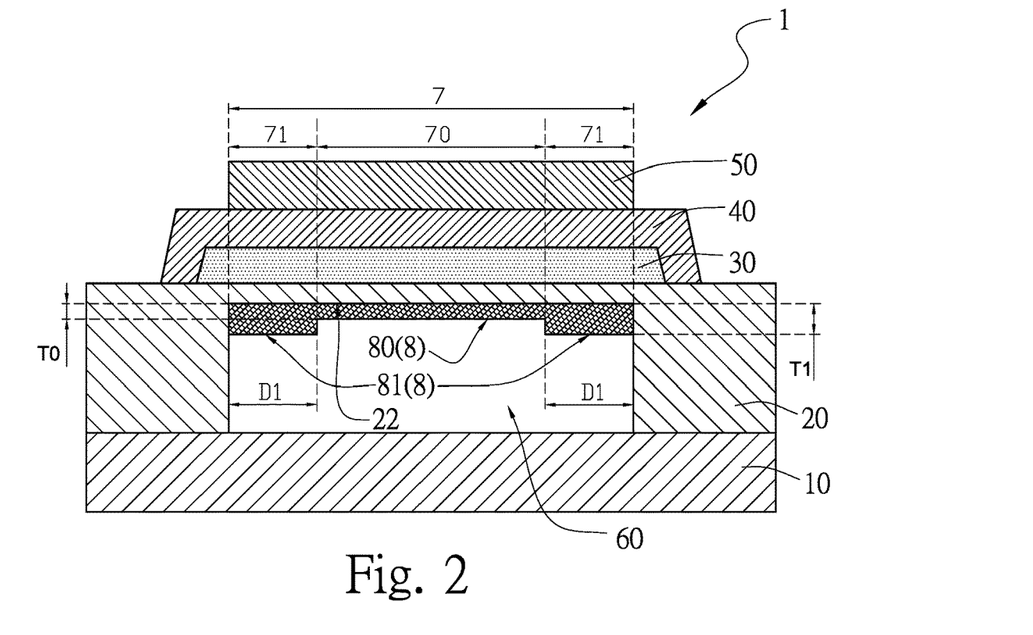
FIG. 2 is a schematic view of another embodiment of a bulk acoustic wave resonator with a mass adjustment structure (Geometrical Configuration II) of the present invention.

Please refer to FIG. 2, which is a schematic view of another embodiment of a bulk acoustic wave resonator with a mass adjustment structure (Geometrical Configuration II) of the present invention. The main structure of the embodiment is basically the same as the structure of the embodiment shown in FIG. 1, except that the mass adjustment structure 8 has a Geometrical Configuration II. The Geometrical Configuration II: the mass adjustment structure 8 comprises a central mass adjustment structure 80 and a peripheral mass adjustment structure 81. The central mass adjustment structure 80 is formed on the top-inner surface 22 of the cavity 60 within the central region 70. The peripheral mass adjustment structure 81 is formed on the top-inner surface 22 of the cavity 60 within the peripheral region 71. The central mass adjustment structure 80 has a thickness T0. The peripheral mass adjustment structure 81 has a thickness T1 and a width D1. By designing and adjusting the dimension of the mass adjustment structure 8 (in current embodiment, such as designing and adjusting the thickness T1 or width D1 of the peripheral mass adjustment structure 81, or the thickness T0 of the central mass adjustment structure 80), the ratio of the reflection acoustic wave and the incident acoustic wave may be properly adjusted such that the Q factor of the bulk acoustic wave resonator 1 may be effectively enhanced and, in the mean while, the spurious mode may be suppressed. In current embodiment, the thickness T1 of the peripheral mass adjustment structure 81 is greater than the thickness T0 of the central mass adjustment structure 80. In another embodiment, the thickness T1 of the peripheral mass adjustment structure 81 is less than the thickness T0 of the central mass adjustment structure 80. In one other embodiment, the thickness T1 of the peripheral mass adjustment structure 81 is unequal to the thickness T0 of the central mass adjustment structure 80.

Figure 3:
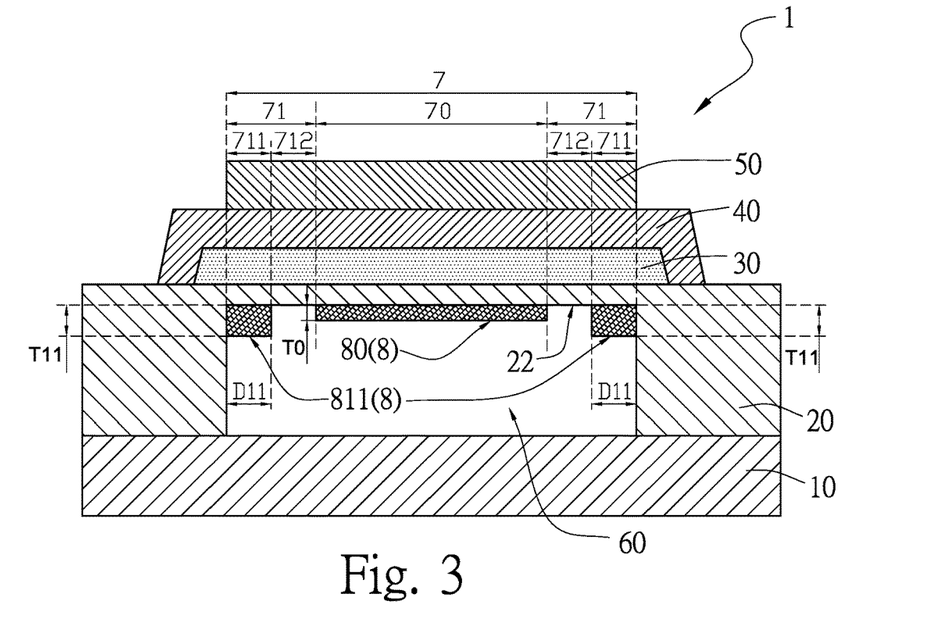
FIG. 3 is a schematic view of another embodiment of a bulk acoustic wave resonator with a mass adjustment structure (Geometrical Configuration III) of the present invention.

Please refer to FIG. 3, which is a schematic view of another embodiment of a bulk acoustic wave resonator with a mass adjustment structure (Geometrical Configuration III) of the present invention. The main structure of the embodiment is basically the same as the structure of the embodiment shown in FIG. 1, except that the mass adjustment structure 8 has a Geometrical Configuration III. The Geometrical Configuration III: the mass adjustment structure 8 comprises a central mass adjustment structure 80 and a first peripheral mass adjustment sub-structure 811. The central mass adjustment structure 80 is formed on the top-inner surface 22 of the cavity 60 within the central region 70. The peripheral region 71 is divided into a first peripheral sub-region 711 and a second peripheral sub-region 712. The second peripheral sub-region 712 is between the central region 70 and the first peripheral sub-region 711. The first peripheral mass adjustment sub-structure 811 is formed on the top-inner surface 22 of the cavity 60 within the first peripheral sub-region 711, and wherein there is no mass adjustment structure 8 formed within the second peripheral sub-region 712. That is that the first peripheral mass adjustment sub-structure 811 in the embodiment of FIG. 3 is a part of the peripheral mass adjustment structure 81 in the embodiment of FIG. 1. The first peripheral mass adjustment sub-structure 811 has a thickness T11 and a width D11. The central mass adjustment structure 80 has a thickness T0. By designing and adjusting the dimension of the mass adjustment structure 8 (in current embodiment, such as designing and adjusting the thickness T11 or the width D11 of the first peripheral mass adjustment sub-structure 811, or the thickness T0 of the central mass adjustment structure 80), the ratio of the reflection acoustic wave and the incident acoustic wave may be properly adjusted such that the Q factor of the bulk acoustic wave resonator 1 may be effectively enhanced and, in the mean while, the spurious mode may be suppressed. In current embodiment, the thickness T11 of the first peripheral mass adjustment sub-structure 811 is greater than the thickness T0 of the central mass adjustment structure 80. In another embodiment, the thickness T11 of the first peripheral mass adjustment sub-structure 811 is less than the thickness T0 of the central mass adjustment structure 80. In one other embodiment, the thickness T11 of the first peripheral mass adjustment sub-structure 811 is unequal to the thickness T0 of the central mass adjustment structure 80.

Figure 4:
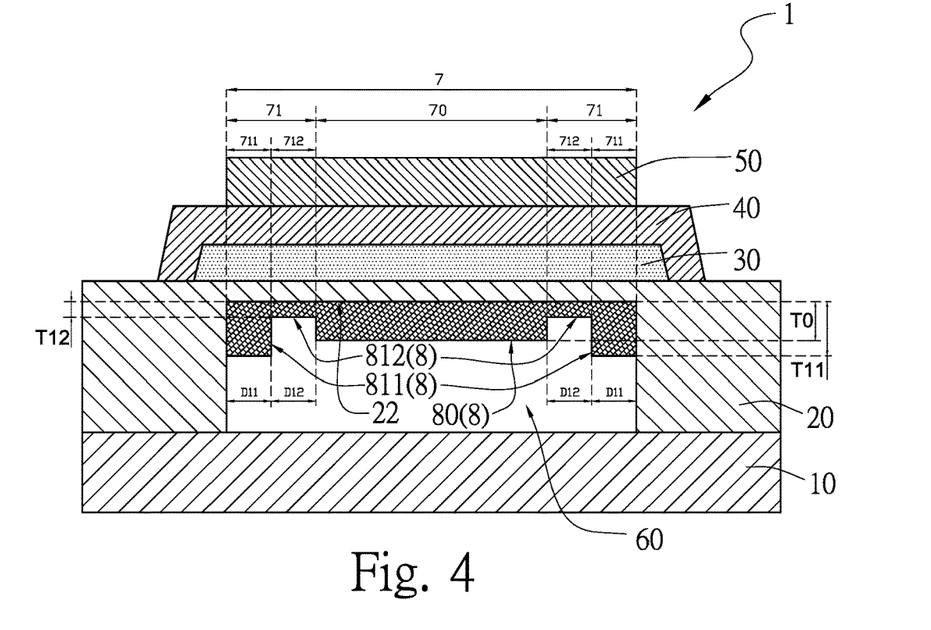
FIG. 4 is a schematic view of another embodiment of a bulk acoustic wave resonator with a mass adjustment structure (Geometrical Configuration IV) of the present invention.

Please refer to FIG. 4, which is a schematic view of another embodiment of a bulk acoustic wave resonator with a mass adjustment structure (Geometrical Configuration IV) of the present invention. The main structure of the embodiment is basically the same as the structure of the embodiment shown in FIG. 1, except that the mass adjustment structure 8 has a Geometrical Configuration IV. The Geometrical Configuration IV: the mass adjustment structure 8 comprises a central mass adjustment structure 80, a first peripheral mass adjustment sub-structure 811 and a second peripheral mass adjustment sub-structure 812. The central mass adjustment structure 80 is formed on the top-inner surface 22 of the cavity 60 within the central region 70. The peripheral region 71 is divided into a first peripheral sub-region 711 and a second peripheral sub-region 712, wherein the second peripheral sub-region 712 is between the central region 70 and the first peripheral sub-region 711. The first peripheral mass adjustment sub-structure 811 is formed on the top-inner surface 22 of the cavity 60 within the first peripheral sub-region 711. The second peripheral mass adjustment sub-structure 812 is formed on the top-inner surface 22 of the cavity 60 within the second peripheral sub-region 712. The first peripheral mass adjustment sub-structure 811 has a thickness T11 and a width D11. The second peripheral mass adjustment sub-structure 812 has a thickness T12 and a width D12. The central mass adjustment structure 80 has a thickness T0. The thickness T12 of the second peripheral mass adjustment sub-structure 812 is unequal to the thickness T11 of the first peripheral mass adjustment sub-structure 811, and the thickness T12 of the second peripheral mass adjustment sub-structure 812 is unequal to the thickness T0 of the central mass adjustment structure 80. By designing and adjusting the dimension of the mass adjustment structure 8 (in current embodiment, such as designing and adjusting the thickness T11 or the width D11 of the first peripheral mass adjustment sub-structure 811, the thickness T12 or the width D12 of the second peripheral mass adjustment sub-structure 812, or the thickness T0 of the central mass adjustment structure 80), the ratio of the reflection acoustic wave and the incident acoustic wave may be properly adjusted such that the Q factor of the bulk acoustic wave resonator 1 may be effectively enhanced and, in the mean while, the spurious mode may be suppressed. In current embodiment, the thickness T11 of the first peripheral mass adjustment sub-structure 811, the thickness T12 of the second peripheral mass adjustment sub-structure 812 and the thickness T0 of the central mass adjustment structure 80 have the relationship T11>T0>T12. In other embodiments, the restrictions on T11, T12 and T0 are as follows: T12 is unequal to T11 (that is T12 may be greater than or less than T11), and T12 is unequal to T0 (that is T12 may be greater than or less than T0), while there is no restrictions on T11 and T0, that it that T11 may be greater than, equal to or less than T0.

Figure 5:
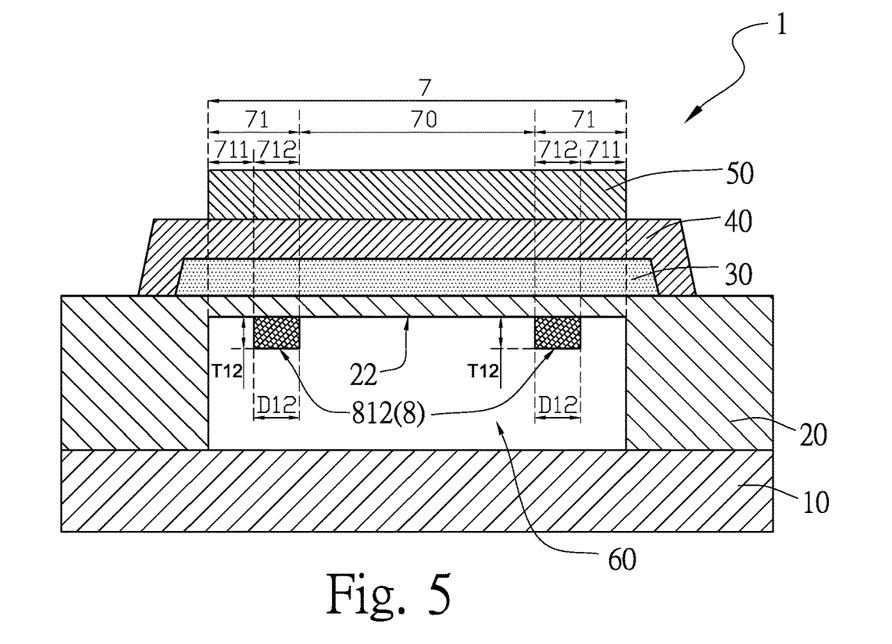
FIG. 5 is a schematic view of another embodiment of a bulk acoustic wave resonator with a mass adjustment structure (Geometrical Configuration V) of the present invention.

Please refer to FIG. 5, which is a schematic view of another embodiment of a bulk acoustic wave resonator with a mass adjustment structure (Geometrical Configuration V) of the present invention. The main structure of the embodiment is basically the same as the structure of the embodiment shown in FIG. 1, except that the mass adjustment structure 8 has a Geometrical Configuration V. The Geometrical Configuration V: the mass adjustment structure 8 comprises a second peripheral mass adjustment sub-structure 812. The peripheral region 71 is divided into a first peripheral sub-region 711 and a second peripheral sub-region 712, wherein the second peripheral sub-region 712 is between the central region 70 and the first peripheral sub-region 711. The second peripheral mass adjustment sub-structure 812 is formed on the top-inner surface 22 of the cavity 60 within the second peripheral sub-region 712, and wherein there is no mass adjustment structure 8 formed within the first peripheral sub-region 711. That is that the second peripheral mass adjustment sub-structure 812 in the embodiment of FIG. 5 is a part of the peripheral mass adjustment structure 81 in the embodiment of FIG. 1. The second peripheral mass adjustment sub-structure 812 has a thickness T12 and a width D12. By designing and adjusting the dimension of the mass adjustment structure 8 (in current embodiment, such as designing and adjusting the thickness T12 or the width D12 of the second peripheral mass adjustment sub-structure 812), the ratio of the reflection acoustic wave and the incident acoustic wave may be properly adjusted such that the Q factor of the bulk acoustic wave resonator 1 may be effectively enhanced and, in the mean while, the spurious mode may be suppressed.

Figure 6:
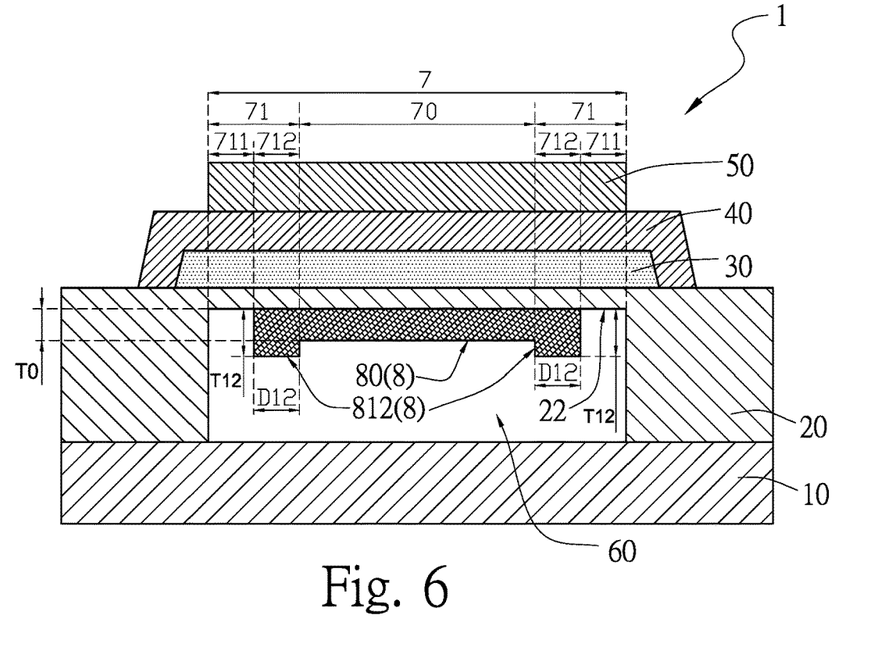
FIG. 6 is a schematic view of another embodiment of a bulk acoustic wave resonator with a mass adjustment structure (Geometrical Configuration VI) of the present invention.

Please refer to FIG. 6, which is a schematic view of another embodiment of a bulk acoustic wave resonator with a mass adjustment structure (Geometrical Configuration VI) of the present invention. The main structure of the embodiment is basically the same as the structure of the embodiment shown in FIG. 1, except that the mass adjustment structure 8 has a Geometrical Configuration VI. The Geometrical Configuration VI: the mass adjustment structure 8 comprises a central mass adjustment structure 80 and a second peripheral mass adjustment sub-structure 812. The central mass adjustment structure 80 is formed on the top-inner surface 22 of the cavity 60 within the central region 70. The peripheral region 71 is divided into a first peripheral sub-region 711 and a second peripheral sub-region 712, wherein the second peripheral sub-region 712 is between the central region 70 and the first peripheral sub-region 711. The second peripheral mass adjustment sub-structure 812 is formed on the top-inner surface 22 of the cavity 60 within the second peripheral sub-region 812, and wherein there is no mass adjustment structure 8 formed within the first peripheral sub-region 711. That is that the second peripheral mass adjustment sub-structure 812 in the embodiment of FIG. 6 is a part of the peripheral mass adjustment structure 81 in the embodiment of FIG. 1. The second peripheral mass adjustment sub-structure 812 has a thickness T12 and a width D12. The central mass adjustment structure 80 has a thickness T0. The thickness T12 of the second peripheral mass adjustment sub-structure 812 is unequal to the thickness T0 of the central mass adjustment structure 80. By designing and adjusting the dimension of the mass adjustment structure 8 (in current embodiment, such as designing and adjusting the thickness T12 or the width D12 of the second peripheral mass adjustment sub-structure 812, or the thickness T0 of the central mass adjustment structure 80), the ratio of the reflection acoustic wave and the incident acoustic wave may be properly adjusted such that the Q factor of the bulk acoustic wave resonator 1 may be effectively enhanced and, in the mean while, the spurious mode may be suppressed. In current embodiment, the thickness T12 of the second peripheral mass adjustment sub-structure 812 is greater than the thickness T0 of the central mass adjustment structure 80. In another embodiment, the thickness T12 of the second peripheral mass adjustment sub-structure 812 is less than the thickness T0 of the central mass adjustment structure 80.

Figure 7:
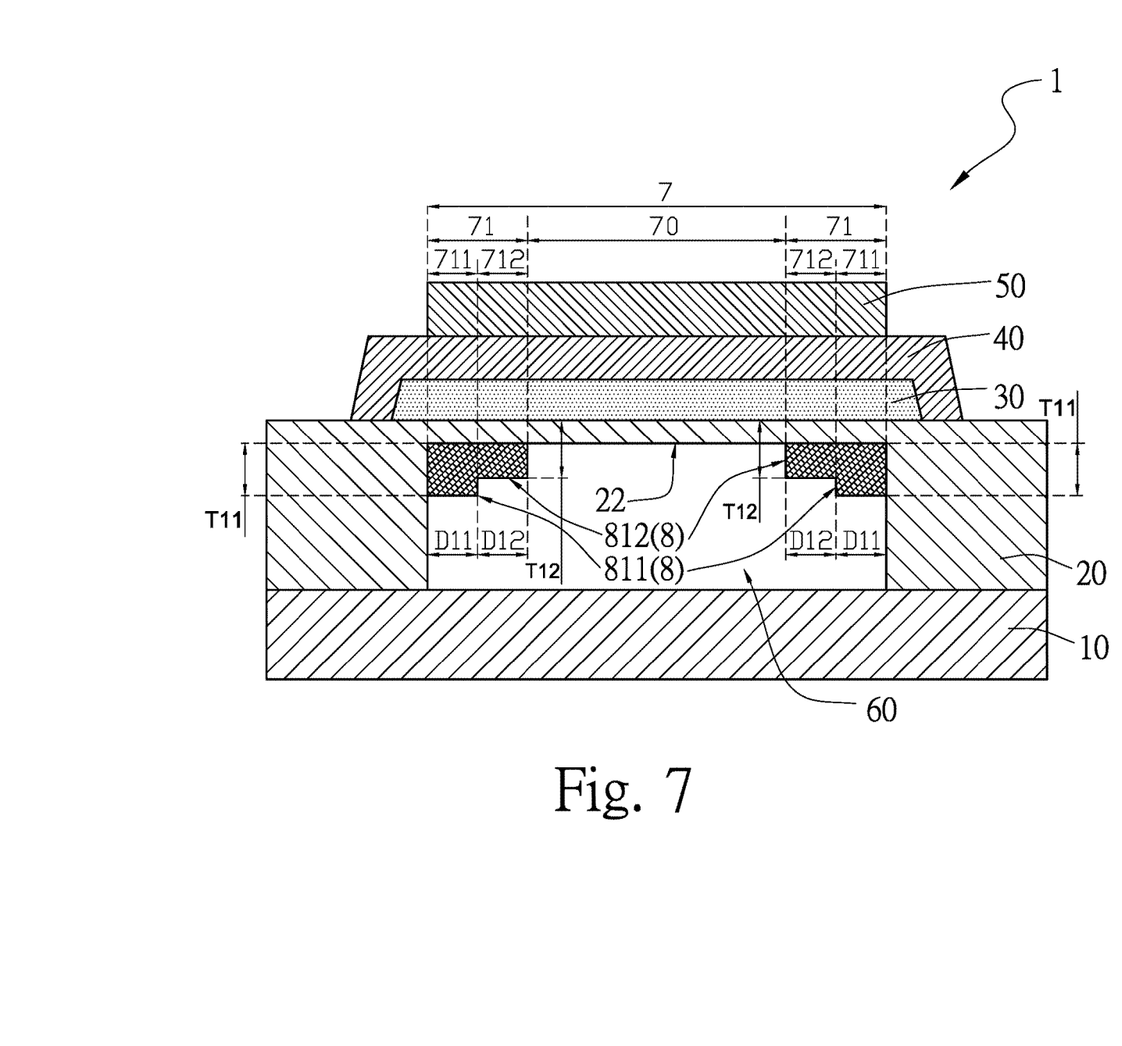
FIG. 7 is a schematic view of another embodiment of a bulk acoustic wave resonator with a mass adjustment structure (Geometrical Configuration VII) of the present invention.

Please refer to FIG. 7, which is a schematic view of another embodiment of a bulk acoustic wave resonator with a mass adjustment structure (Geometrical Configuration VII) of the present invention. The main structure of the embodiment is basically the same as the structure of the embodiment shown in FIG. 1, except that the mass adjustment structure 8 has a Geometrical Configuration VII. The Geometrical Configuration VII: the mass adjustment structure 8 comprises a first peripheral mass adjustment sub-structure 811 and a second peripheral mass adjustment sub-structure 812. The peripheral region 71 is divided into a first peripheral sub-region 711 and a second peripheral sub-region 712, wherein the second peripheral sub-region 712 is between the central region 70 and the first peripheral sub-region 711. The first peripheral mass adjustment sub-structure 811 is formed on the top-inner surface 22 of the cavity 60 within the first peripheral sub-region 711. The second peripheral mass adjustment sub-structure 812 is formed on the top-inner surface 22 of the cavity 60 within the second peripheral sub-region 712. The first peripheral mass adjustment sub-structure 811 has a thickness T11 and a width D11. The second peripheral mass adjustment sub-structure 812 has a thickness T12 and a width D12. The thickness T12 of the second peripheral mass adjustment sub-structure 812 is unequal to the thickness T11 of the first peripheral mass adjustment sub-structure 811. By designing and adjusting the dimension of the mass adjustment structure 8 (in current embodiment, such as designing and adjusting the thickness T11 or the width D11 of the first peripheral mass adjustment sub-structure 811, or the thickness T12 or the width D12 of the second peripheral mass adjustment sub-structure 812), the ratio of the reflection acoustic wave and the incident acoustic wave may be properly adjusted such that the Q factor of the bulk acoustic wave resonator 1 may be effectively enhanced and, in the mean while, the spurious mode may be suppressed. In current embodiment, the thickness T11 of the first peripheral mass adjustment sub-structure 811 is greater than the thickness T12 of the second peripheral mass adjustment substructure 812. In another embodiment, the thickness T11 of the first peripheral mass adjustment sub-structure 811 is less than the thickness T12 of the second peripheral mass adjustment sub-structure 812.

The present invention further provides a bulk acoustic wave filter which comprises a plural of bulk acoustic wave resonators formed on a substrate 10. Each of the plural of bulk acoustic wave resonators comprises a supporting layer 20, a lower metal layer 30, a piezoelectric layer 40 and an upper metal layer 50 (as the structure shown in FIG. 1). The supporting layer 20 is formed on the substrate 10, wherein the supporting layer 20 has a cavity 60; the cavity 60 has a top-inner surface 22. The lower metal layer 30 is formed on the supporting layer 20. The piezoelectric layer 40 is formed on the lower metal layer 30. The upper metal layer 50 is formed on the piezoelectric layer 40. An acoustic wave resonance region 7 is defined by an overlapping region of projections of the upper metal layer 50, the piezoelectric layer 40, the lower metal layer 30, the supporting layer 20 and the cavity 60, wherein the acoustic wave resonance region 7 is divided into a peripheral region 71 and a central region 70. Among the plural of bulk acoustic wave resonators, at least two of them have a mass adjustment structure 8 respectively (in present invention, a bulk acoustic wave resonator has a mass adjustment structure 8 is a bulk acoustic wave resonator 1). The mass adjustment structure 8 may have any one Geometrical Configuration selected from Geometrical Configuration I to Geometrical Configuration VII. Among these bulk acoustic wave resonators 1 (each of which has a mass adjustment structure 8), at least two of them have the mass adjustment structures 8 with non-identical Geometrical Configurations. Herein, there are two types of non-identical Geometrical Configurations. The first type of non-identical Geometrical Configurations: Among the at least two bulk acoustic wave resonators 1 (each of which has a mass adjustment structure 8), at least two of them have different Geometrical Configurations (For example, in the embodiment of FIG. 8, one of the bulk acoustic wave resonators 1 has Geometrical Configuration I, the other has Geometrical Configuration II; the embodiment of FIG. 8 will be explained in detail later). The second type of non-identical Geometrical Configurations: Among the at least two bulk acoustic wave resonators 1 (each of which has a mass adjustment structure 8), at least two of them have the same Geometrical Configuration, but at least part of the dimensions of their mass adjustment structures 8 are different (For example, in the embodiment of FIG. 9, both of the bulk acoustic wave resonators 1 have Geometrical Configuration I, however the thickness T1 or the width D1 of the peripheral mass adjustment structure 81 are different from that of the peripheral mass adjustment structure 81'; the embodiment of FIG. 9 will be explained in detail later). In generally, a bulk acoustic wave filter comprises two kinds of bulk acoustic wave resonators. The first kind of bulk acoustic wave resonators is a series bulk acoustic wave resonator which has a higher resonance frequency. The second kind of bulk acoustic wave resonators is a shunt bulk acoustic wave resonator which has a lower resonance frequency. Since the boundary condition of the periphery of the acoustic resonance film of the bulk acoustic wave resonator may be changed by forming the mass adjustment structure, the ratio of the reflection acoustic wave and the incident acoustic wave may also be changed. Different configuration designs of the mass adjustment structure or the same configuration design of the mass adjustment structure but with different dimensions may cause different boundary conditions of the periphery of the acoustic resonance film such that the ratio of the reflection acoustic wave and the incident acoustic wave is different. Therefore, by respectively designing and adjusting the mass adjustment structures (having non-identical Geometrical Configurations) of the at least two bulk acoustic wave resonators (including the series bulk acoustic wave resonator with higher resonance frequency and the shunt bulk acoustic wave resonator with lower resonance frequency) of the bulk acoustic wave filter, the two kinds of the bulk acoustic wave resonators of the bulk acoustic wave filter may be adjusted respectively, so as to respectively enhance the Q factor of both the series bulk acoustic wave resonator with higher resonance frequency and the shunt bulk acoustic wave resonator with lower resonance frequency and, in the mean while, suppress the spurious mode.

Figure 8:
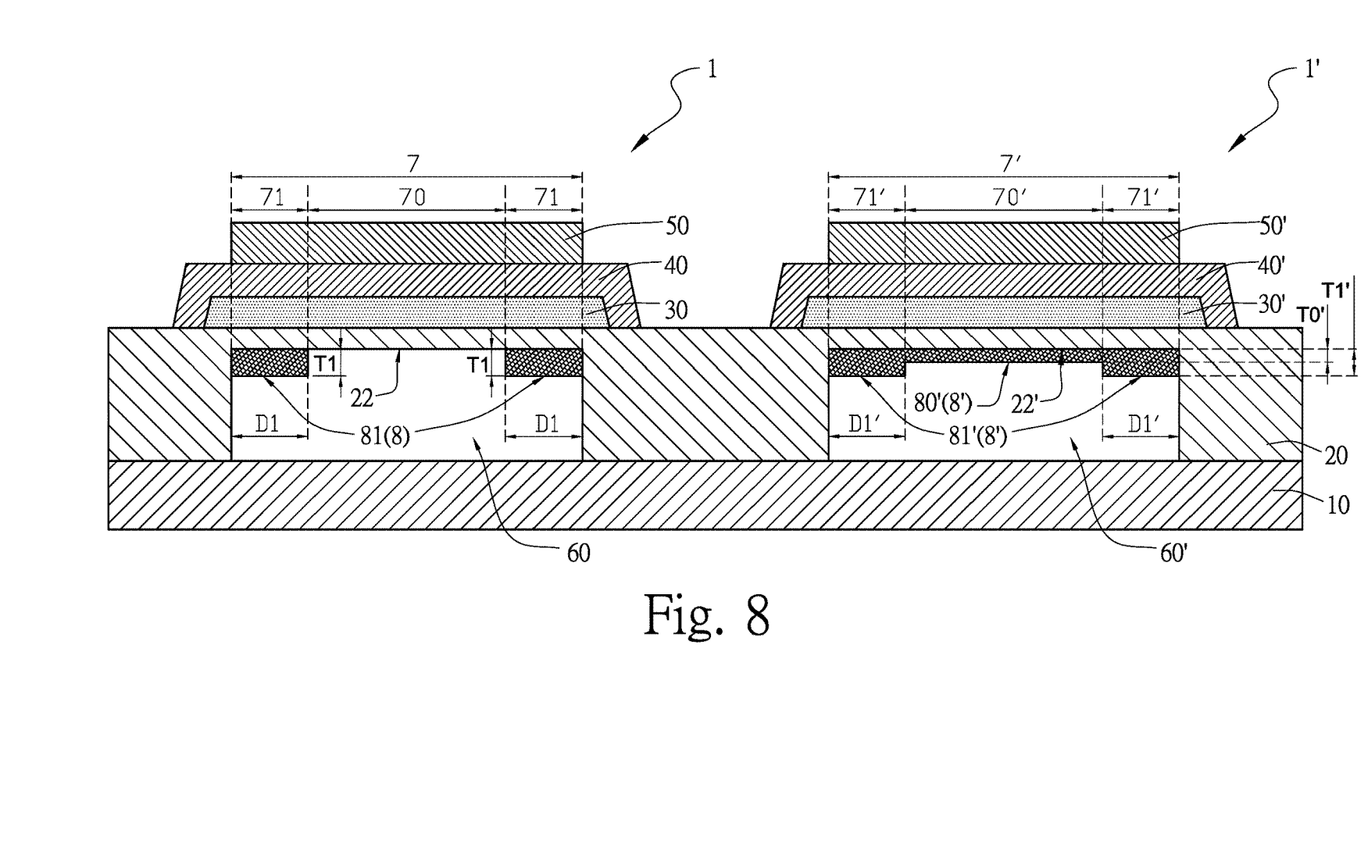
FIG. 8 and FIG. 9 are the schematic views of the embodiments of a bulk acoustic wave filter of the present invention.

Please refer to FIG. 8 which is the schematic view of an embodiment of a bulk acoustic wave filter of the present invention. As shown in the embodiment of FIG. 8, there are two bulk acoustic wave resonators, each of which has a mass adjustment structure. The mass adjustment structures of the two bulk acoustic wave resonators have different Geometrical Configurations (that is the first type of non-identical Geometrical Configurations). The filter comprises a bulk acoustic wave resonator 1 and a bulk acoustic wave resonator 1', wherein the bulk acoustic wave resonator 1 and the bulk acoustic wave resonator 1' are formed on a same substrate 20. In current embodiment, the bulk acoustic wave resonator 1 may be one of a series bulk acoustic wave resonator with higher resonance frequency and a shunt bulk acoustic wave resonator with lower resonance frequency, while the bulk acoustic wave resonator 1' may be one of the other. The structure of the bulk acoustic wave resonator 1 is the same as the structure of the embodiment shown in FIG. 1. The bulk acoustic wave resonator 1 comprises a supporting layer 20, a lower metal layer 30, a piezoelectric layer 40, an upper metal layer 50, a cavity 60 and a mass adjustment structure 8. The supporting layer 20 is formed on the substrate 10. The lower metal layer 30 is formed on the supporting layer 20. The piezoelectric layer 40 is formed on the lower metal layer 30. The upper metal layer 50 is formed on the piezoelectric layer 40. The cavity 60 is formed under the supporting layer 20. An acoustic wave resonance region 7 is defined by an overlapping region of projections of the upper metal layer 50, the piezoelectric layer 40, the lower metal layer 30, the supporting layer 20 and the cavity 60, wherein the acoustic wave resonance region 7 is divided into a peripheral region 71 and a central region 70. The mass adjustment structure 8 has a Geometrical Configuration I. The mass adjustment structure 8 comprises a peripheral mass adjustment structure 81, wherein the peripheral mass adjustment structure 81 is formed on a top-inner surface 22 of the cavity 60 within the peripheral region 71; wherein the peripheral mass adjustment structure 81 has a thickness T1 and a width D1. The structure of the bulk acoustic wave resonator 1' is the same as the structure of the embodiment shown in FIG. 2. The bulk acoustic wave resonator 1' comprises the supporting layer 20, a lower metal layer 30', a piezoelectric layer 40', an upper metal layer 50', a cavity 60' and a mass adjustment structure 8'. The supporting layer 20 is formed on the substrate 10. The lower metal layer 30' is formed on the supporting layer 20. The piezoelectric layer 40' is formed on the lower metal layer 30'. The upper metal layer 50' is formed on the piezoelectric layer 40'. The cavity 60' is formed under the supporting layer 20. An acoustic wave resonance region 7' is defined by an overlapping region of projections of the upper metal layer 50', the piezoelectric layer 40', the lower metal layer 30', the supporting layer 20 and the cavity 60', wherein the acoustic wave resonance region 7' is divided into a peripheral region 71' and a central region 70'. The mass adjustment structure 8' has a Geometrical Configuration II. The mass adjustment structure 8' comprises a central mass adjustment structure 80' and a peripheral mass adjustment structure 81'. The central mass adjustment structure 80' is formed on a top-inner surface 22' of the cavity 60' within the central region 70'. The central mass adjustment structure 80' has a thickness T0'. The peripheral mass adjustment structure 81' is formed on the top-inner surface 22' of the cavity 60' within the peripheral region 71'. The peripheral mass adjustment structure 81' has a thickness T1' and a width D1'. The mass adjustment structure 8 and the mass adjustment structure 8' have different Geometrical Configurations respectively. That is the first type of non-identical Geometrical Configurations. In some embodiments, any two of the bulk acoustic wave resonators 1 (each of them has a mass adjustment structure 8) of the bulk acoustic wave filter have different Geometrical Configurations, that belongs to the first type of non-identical Geometrical Configurations.

Figure 9:
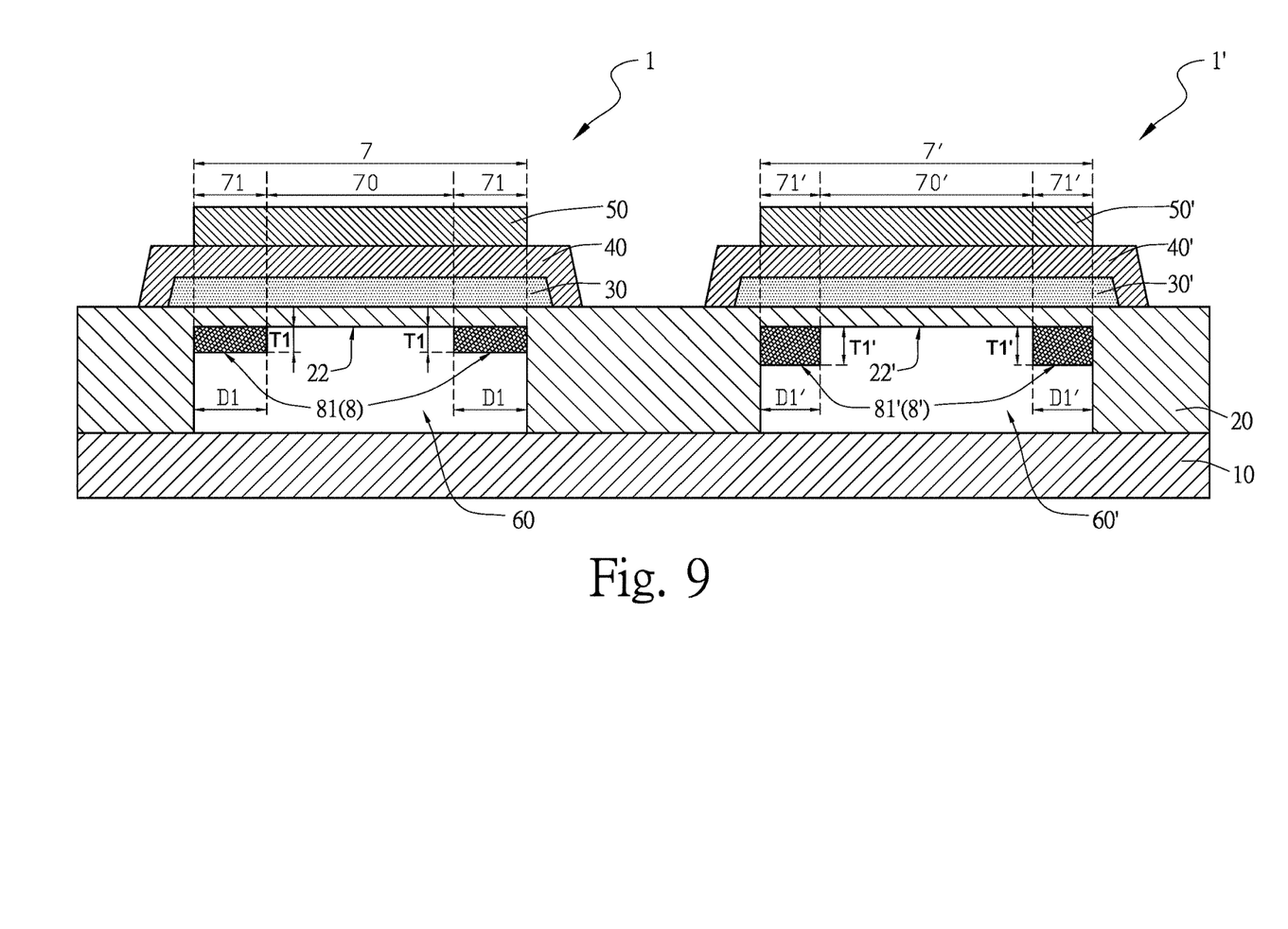

Please refer to FIG. 9, which is the schematic view of an embodiment of a bulk acoustic wave filter of the present invention. As shown in the embodiment of FIG. 9, there are two bulk acoustic wave resonators, each of which has a mass adjustment structure. The mass adjustment structures of the two bulk acoustic wave resonators have the same Geometrical Configuration, but at least part of the dimensions of their mass adjustment structures are different (that is the second type of non-identical Geometrical Configurations). The main structure of the embodiment in FIG. 9 is basically the same as the structure of the embodiment in FIG. 8, except that the bulk acoustic wave resonator 1' has the same structure as the embodiment in FIG. 1. In current embodiment, the bulk acoustic wave resonator 1 may be one of a series bulk acoustic wave resonator with higher resonance frequency and a shunt bulk acoustic wave resonator with lower resonance frequency, while the bulk acoustic wave resonator 1' may be one of the other. The bulk acoustic wave resonator 1' comprises the supporting layer 20, a lower metal layer 30', a piezoelectric layer 40', an upper metal layer 50', a cavity 60' and a mass adjustment structure 8'. The supporting layer 20 is formed on the substrate 10. The lower metal layer 30' is formed on the supporting layer 20. The piezoelectric layer 40' is formed on the lower metal layer 30'. The upper metal layer 50' is formed on the piezoelectric layer 40'. The cavity 60' is formed under the supporting layer 20. An acoustic wave resonance region 7' is defined by an overlapping region of projections of the upper metal layer 50', the piezoelectric layer 40', the lower metal layer 30', the supporting layer 20 and the cavity 60', wherein the acoustic wave resonance region 7' is divided into a peripheral region 71' and a central region 70'. The mass adjustment structure 8' has a Geometrical Configuration I. The mass adjustment structure 8' comprises a peripheral mass adjustment structure 81', wherein the peripheral mass adjustment structure 81' is formed on a top-inner surface 22' of the cavity 60' within the peripheral region 71'; wherein the peripheral mass adjustment structure 81' has a thickness T1' and a width D1'. The mass adjustment structure 8 and the mass adjustment structure 8' both have Geometrical Configuration I. However, the thickness T1 of the peripheral mass adjustment structure 81 is less than the thickness T1' of the peripheral mass adjustment structure 81' and the width D1 of the peripheral mass adjustment structure 81 is greater than the width D1' of the peripheral mass adjustment structure 81'. Therefore, it belongs to the second type of non-identical Geometrical Configurations. In some embodiments, any two of the bulk acoustic wave resonators 1 (each of them has a mass adjustment structure 8) of the bulk acoustic wave filter have the same Geometrical Configuration, but at least part of the dimensions of their mass adjustment structures 8 are different (such as the thickness' or the widths of the peripheral mass adjustment structures are different or the thickness' of the central mass adjustment structures are different), that belongs to the second type of non-identical Geometrical Configurations.

As disclosed in the above description and attached drawings, the present invention can provide a bulk acoustic wave resonator with a mass adjustment structure and its application to bulk acoustic wave filter. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A bulk acoustic wave resonator with a mass adjustment structure comprising:
    a supporting layer formed on a substrate, wherein said supporting layer has a cavity, said cavity has a top-inner surface:
    a lower metal layer formed on a top surface of said supporting layer;
    a piezoelectric layer formed on said lower metal layer:
    an upper metal layer formed on said piezoelectric layer, wherein an acoustic wave resonance region is defined by a fully overlapping region of projections of said upper metal layer,
    said piezoelectric layer, said lower metal layer, said supporting layer and said cavity, wherein
    said acoustic wave resonance region is divided into a peripheral region and a central region; and
    a mass adjustment structure, wherein said mass adjustment structure comprises a peripheral mass adjustment structure, wherein said peripheral mass adjustment structure is formed on said top-inner surface within said peripheral region.

2. The bulk acoustic wave resonator with a mass adjustment structure according to claim 1, wherein said mass adjustment structure further comprises a central mass adjustment structure, wherein said central mass adjustment structure is formed on said top-inner surface within said central region; and wherein a thickness of said peripheral mass adjustment structure is unequal to a thickness of said central mass adjustment structure.

3. The bulk acoustic wave resonator with a mass adjustment structure according to claim 1, wherein said mass adjustment structure further comprises a central mass adjustment structure, wherein said central mass adjustment structure is formed on said top-inner surface within said central region; wherein said peripheral region is divided into a first peripheral sub-region and a second peripheral sub-region; wherein said second peripheral sub-region is between said central region and said first peripheral sub-region; and wherein said peripheral mass adjustment structure includes a first peripheral mass adjustment sub-structure, said first peripheral mass adjustment sub-structure is formed within said first peripheral sub-region.

4. The bulk acoustic wave resonator with a mass adjustment structure according to claim 3, wherein said peripheral mass adjustment structure further includes a second peripheral mass adjustment sub-structure, wherein said second peripheral mass adjustment sub-structure is formed within said second peripheral sub-region; wherein a thickness of said second peripheral mass adjustment sub-structure is unequal to a thickness of said first peripheral mass adjustment sub-structure; and wherein said thickness of said second peripheral mass adjustment sub-structure is unequal to a thickness of said central mass adjustment structure.

5. The bulk acoustic wave resonator with a mass adjustment structure according to claim 1, wherein said peripheral mass adjustment structure includes a second peripheral mass adjustment sub-structure; wherein said peripheral region is divided into a first peripheral sub-region and a second peripheral sub-region; wherein said second peripheral sub-region is between said central region and said first peripheral sub-region; and wherein said second peripheral mass adjustment sub-structure is formed within said second peripheral sub-region.

6. The bulk acoustic wave resonator with a mass adjustment structure according to claim 5, wherein said mass adjustment structure further comprises a central mass adjustment structure, wherein said central mass adjustment structure is formed on said top-inner surface within said central region; and wherein a thickness of said second peripheral mass adjustment sub-structure is unequal to a thickness of said central mass adjustment structure.

7. The bulk acoustic wave resonator with a mass adjustment structure according to claim 5, wherein said peripheral mass adjustment structure further includes a first peripheral mass adjustment sub-structure, wherein said first peripheral mass adjustment sub-structure is formed within said first peripheral sub-region; and wherein a thickness of said second peripheral mass adjustment sub-structure is unequal to a thickness of said first peripheral mass adjustment sub-structure.

8. The bulk acoustic wave resonator with a mass adjustment structure according to claim 1, wherein said mass adjustment structure is made of a metal material, an insulator material, or a semiconductor material.

9. The bulk acoustic wave resonator with a mass adjustment structure according to claim 8, wherein said metal material is at least one material selected from the group consisting of: Ti, Mo, Pt, Al, Au, W and Ru; said insulator material is at least one material selected from the group consisting of: silicon oxide, silicon nitride, aluminum nitride and polymer; said semiconductor material is at least one material selected from the group consisting of: GaAs, InGaP, InGaAs and InP.

10. The bulk acoustic wave resonator with a mass adjustment structure according to claim 1, wherein said supporting layer is at least one material selected from the group consisting of: silicon oxide, silicon nitride, aluminum nitride and polymer.

11. A bulk acoustic wave filter comprising:
a plural of bulk acoustic wave resonators formed on a substrate, wherein each of said plural of bulk acoustic wave resonators comprises:
a supporting layer formed on said substrate, wherein said supporting layer has a cavity, said cavity has a top-inner surface;
a lower metal layer formed on a top surface of said supporting layer;
a piezoelectric layer formed on said lower metal layer; and
an upper metal layer formed on said piezoelectric layer, wherein an acoustic wave resonance region is defined by a fully overlapping region of projections of said upper metal layer, said piezoelectric layer, said lower metal layer, said supporting layer and said cavity;
wherein said acoustic wave resonance region is divided into a peripheral region and a central region;
wherein at least two of said plural of bulk acoustic wave resonators have a mass adjustment structure respectively, wherein said mass adjustment structure has one of the following Geometrical Configurations:

Geometrical Configuration I: said mass adjustment structure comprises a peripheral mass adjustment structure, wherein said peripheral mass adjustment structure is formed on said top-inner surface within said peripheral region; and wherein said peripheral mass adjustment structure has a thickness and a width;

Geometrical Configuration II: said mass adjustment structure comprises a central mass adjustment structure and a peripheral mass adjustment structure; wherein said central mass adjustment structure is formed on said top-inner surface within said central region; wherein said peripheral mass adjustment structure is formed on said top-inner surface within said peripheral region; wherein said central mass adjustment structure has a thickness; wherein
said peripheral mass adjustment structure has a thickness and a width; and wherein said thickness of said peripheral mass adjustment structure is unequal to said thickness of said central mass adjustment structure;

Geometrical Configuration III: said mass adjustment structure comprises a central mass adjustment structure and a first peripheral mass adjustment sub-structure; wherein said central mass adjustment structure is formed on said top-inner surface within said central region; wherein said peripheral region is divided into a first peripheral sub-region and a second peripheral sub-region; wherein said second peripheral sub-region is between said central region and said first peripheral sub-region; wherein said first peripheral mass adjustment sub-structure is formed on said top-inner surface within said first peripheral sub-region;
wherein said first peripheral mass adjustment sub-structure has a thickness and a width; and wherein said central mass adjustment structure has a thickness;

Geometrical Configuration IV: said mass adjustment structure comprises a central mass adjustment structure, a first peripheral mass adjustment sub-structure and a second peripheral mass adjustment sub-structure; wherein said central mass adjustment structure is formed on said top-inner surface within said central region; wherein said peripheral region is divided into a first peripheral sub-region and a second peripheral sub-region; wherein said second peripheral sub-region is between said central region and said first peripheral sub-region;
wherein said first peripheral mass adjustment sub-structure is formed on said top inner surface within said first peripheral sub-region; wherein said second peripheral mass adjustment sub-structure is formed on said top-inner surface within said second peripheral sub-region; wherein said first peripheral mass adjustment sub-structure has a thickness and
a width; wherein said second peripheral mass adjustment sub-structure has a thickness and a width; wherein said central mass adjustment structure has a thickness; wherein said thickness of said second peripheral mass adjustment sub-structure is unequal to said thickness of said first peripheral mass adjustment sub-structure; and wherein said thickness of said second peripheral mass adjustment sub-structure is unequal to said thickness of said central mass adjustment structure;

Geometrical Configuration V: said mass adjustment structure comprises a second peripheral mass adjustment sub-structure; wherein said peripheral region is divided into a first peripheral sub-region and a second peripheral sub-region; wherein said second peripheral sub-region is between said central region and said first peripheral sub-region;

wherein said second peripheral mass adjustment sub-structure is formed on said top-inner surface within said second peripheral sub-region; and wherein said second peripheral mass adjustment sub-structure has a thickness and a width;

Geometrical Configuration VI: said mass adjustment structure comprises a central mass adjustment structure and a second peripheral mass adjustment sub-structure; wherein said central mass adjustment structure is formed on said top-inner surface within said central region; wherein said peripheral region is divided into a first peripheral sub-region and a second peripheral sub-region; wherein said second peripheral sub-region is between said central region and said first peripheral sub-region; wherein said second peripheral mass adjustment sub-structure is formed on said top-inner surface within said second peripheral sub-region; wherein said second peripheral mass adjustment sub-structure has a thickness and a width; wherein said central mass adjustment structure has a thickness; and wherein said thickness of said second peripheral mass adjustment sub-structure is unequal to said thickness of said central mass adjustment structure; and Geometrical Configuration VII: said mass adjustment structure comprises a first peripheral mass adjustment sub-structure and a second peripheral mass adjustment substructure;

wherein said peripheral region is divided into a first peripheral sub-region and a second peripheral sub-region; wherein said second peripheral sub-region is between said central region and said first peripheral sub-region; wherein said first peripheral mass adjustment sub-structure is formed on said top-inner surface within said first peripheral sub-region;

wherein said second peripheral mass adjustment sub-structure is formed on said top inner surface within said second peripheral sub-region; wherein said first peripheral mass adjustment sub-structure has a thickness and a width; wherein said second peripheral mass adjustment sub-structure has a thickness and a width; and wherein said thickness of said second peripheral mass adjustment sub-structure is unequal to said thickness of said first peripheral mass adjustment sub-structure; and wherein at least two of said mass adjustment structures have non-identical Geometrical Configurations.

12. The bulk acoustic wave filter according to claim 11, wherein each of said mass adjustment structures is made of a metal material, an insulator material or a semiconductor material.

13. The bulk acoustic wave filter according to claim 12, wherein said metal material is at least one material selected from the group consisting of: Ti, Mo, Pt, Al, Au, W and Ru; said insulator material is at least one material selected from the group consisting of: silicon oxide, silicon nitride, aluminum nitride and polymer; said semiconductor material is at least one material selected from the group consisting of: GaAs, InGaP, InGaAs and InP.

14. The bulk acoustic wave filter according to claim 11, wherein said supporting layer is at least one material selected from the group consisting of: silicon oxide, silicon nitride, aluminum nitride and polymer.

* * * * *